United States Patent
Endo et al.

(10) Patent No.: US 7,858,494 B2
(45) Date of Patent: Dec. 28, 2010

(54) LAMINATED SUBSTRATE MANUFACTURING METHOD AND LAMINATED SUBSTRATE MANUFACTURED BY THE METHOD

(75) Inventors: Akihiko Endo, Tokyo (JP); Hideki Nishihata, Tokyo (JP); Nobuyuki Morimoto, Tokyo (JP)

(73) Assignee: Sumco Corporation, Tokyo (JP)

( * ) Notice: Subject to any disclaimer, the term of this patent is extended or adjusted under 35 U.S.C. 154(b) by 1025 days.

(21) Appl. No.: 11/466,964

(22) Filed: Aug. 24, 2006

(65) Prior Publication Data

US 2007/0048971 A1 Mar. 1, 2007

(30) Foreign Application Priority Data

Aug. 25, 2005 (JP) ............... 2005-244440

(51) Int. Cl.
*H01L 21/30* (2006.01)
*H01L 21/46* (2006.01)

(52) U.S. Cl. ............... 438/458; 438/459; 257/E21.088; 257/E21.568

(58) Field of Classification Search ................. 438/458, 438/459; 257/E21.088, E21.568
See application file for complete search history.

(56) References Cited

U.S. PATENT DOCUMENTS

| 3,642,528 | A | * | 2/1972 | Kimura | 438/580 |
| 5,442,211 | A | | 8/1995 | Kita | |
| 5,773,355 | A | | 6/1998 | Inoue et al. | |
| 6,319,102 | B1 | * | 11/2001 | Luo | 451/102 |
| 6,627,519 | B2 | * | 9/2003 | Kwon et al. | 438/459 |
| 6,717,430 | B2 | * | 4/2004 | Burch | 324/765 |
| 2003/0071631 | A1 | * | 4/2003 | Alexander | 324/500 |

FOREIGN PATENT DOCUMENTS

| EP | 0 269 294 A1 | 11/1987 |
| EP | 1 345 272 A1 | 9/2003 |
| GB | 2 206 445 A | 1/1989 |
| JP | 2000-030992 | 1/2000 |
| JP | 3142206 | 12/2000 |
| KR | 2000-0076966 | 12/2000 |
| KR | 10-2004-0024636 | 3/2004 |

OTHER PUBLICATIONS

BYU Resistivity and Mobility calculator (http://cleanroom.byu.edu/ResistivityCal.phtml.*
Takao Abe, Advanced Electronics I-5, p. 45, 1994, along with a partial English-language translation.

* cited by examiner

*Primary Examiner*—David S Blum
(74) *Attorney, Agent, or Firm*—Greenblum & Bernstein, P.L.C.

(57) ABSTRACT

Adhesion of particles due to static buildup during a laminated substrate manufacturing process is constrained, so as to reduce generation of a void or a blister in a lamination step and improve yield. A laminate 13 is formed by superimposing a first semiconductor substrate 11, which is to be an active layer, on a second semiconductor substrate 12, which is to be a supporting substrate, via an oxide film 11*a*. Electric resistance of either or both of the first and second semiconductor substrates 11 and 12 before superimposition is 0.005-0.2 Ωcm.

4 Claims, 4 Drawing Sheets

LAMINATED SUBSTRATE MANUFACTURING METHOD AND LAMINATED SUBSTRATE MANUFACTURED BY THE METHOD

BACKGROUND OF THE INVENTION

1. Field of the Invention

The present invention relates to a manufacturing method of a laminated substrate by laminating a first semiconductor substrate to a second semiconductor substrate via an oxide film. More particularly, the present invention relates to a manufacturing method of an SOI (Silicon On Insulator) substrate in using a silicon substrate as the semiconductor substrate for example, and a laminated substrate manufactured by the method.

2. Description of the Related Art

Conventionally, as manufacturing methods of an SOI substrate, there are known a manufacturing method of an SOI substrate utilizing a lamination method of laminating a first semiconductor substrate, that is to be an SOI layer, to a second semiconductor substrate, that is to be a supporting substrate, via an oxide film, and a manufacturing method of the SOI substrate utilizing an SIMOX (Separation by IMplanted OXygen) method of forming the oxide film within a silicon substrate by ion implantation of oxygen in high concentration into the silicon substrate. As compared with the manufacturing method of the SOI substrate utilizing the SIMOX method, however, the manufacturing method of the SOI substrate utilizing the lamination method requires to use two substrates, i.e., the first and second silicon substrates, and the method may cause a lamination defect, such as a void (FIG. 4) or a blister (FIG. 5), being generated due to particles, organic substances, or the like adhered to the substrate surface in a lamination step, or degradation in the electrical property of a device due to the contamination of the substrate with a dopant or a metal, which lead to the difficulty in controlling the yield of the laminated substrate.

In order to eliminate these problems, the technique with regard to the environment, i.e., a clean room, where the lamination of the aforementioned two substrates is carried out has been improved, and an automated lamination apparatus, such as a clean robot, without the need of human intervention has been introduced, enabling the yield of the SOI substrate utilizing the lamination method to be improved substantially. In this regard, methods of improving the above-described technique with regard to the clean room include methods of: providing a dust-proof air filter in a vent hole to prevent the particles or gaseous contaminants in the air from penetrating into the clean room; utilizing a substrate case which can be handled without introducing the atmosphere external to the apparatus in handling the substrate into the apparatus; decreasing the generation of dust by reducing the dust generation of respective members in the clean room; preventing the static buildup on the substrate by means of an ionizer which ionizes the air in the clean room to neutralize charges on the substrate surface with ions of the reversed polarity; or washing the substrate with a chemical solution added with a surfactant.

Meanwhile, there has been developed a thin film SOI substrate with the SOI layer of 0.1 μm or less in thickness, in order to speed up a circuit by reducing the junction capacitance (electric capacity) between a source/drain and the substrate, to reduce the power consumption of the circuit by reducing a leak current, or to enhance the integration by miniaturization.

In this thin film Sol substrate, there is a problem where the particles with a size on the order of 0.1 μm, which has not been an issue previously, cause the lamination defect.

In order to eliminate the problem, there are disclosed the manufacturing method of the laminated semiconductor substrate in which the carbon concentration in the atmosphere in laminating the two semiconductor substrates is set to 100 ppt (part per trillion) or less (for example, see Patent Document 1), or the manufacturing method of a laminated wafer using a hydrogen ion implantation separation method in which the carbon concentration on the lamination surface of the two substrates is set to $3 \times 10^{14}$ atoms/cm$^2$ or less (for example, see Patent Document 2). In the manufacturing method of the laminated semiconductor substrate in the aforementioned Patent Document 1, there is described that, by controlling the carbon concentration in the lamination atmosphere, particularly of the principal surface of the substrate upon lamination, to constrain the carbon concentration on the lamination surface of the two substrates, it achieves high bonding strength even after a lamination heat treatment and the separation does not occur at the lamination surface. Additionally, in the manufacturing method of the laminated wafer in Patent Document 2, there is described that, by setting the carbon concentration on the lamination surface, as an index of a bonding failure of the laminated substrate and organic substance contamination of the lamination surface, to $3 \times 10^{14}$ atoms/cm$^2$ or less, it can prevent generation of a separation failure in which the substrates do not separate at an ion implantation area after a separation heat treatment or of the bonding failure in which the whole or a portion of the lamination surface of the two substrates separates, as well as generation of the void when the subsequent bonding heat treatment at a high temperature is carried out.

[Patent Document 1] Japanese Patent No. 3142206 (claim 1, paragraphs [0005] and [0009])

[Patent Document 2] Japanese Unexamined Patent Publication (Kokai) No. 2000-30992 (claim 2, paragraphs [0009], [0010], and [0011])

SUMMARY OF THE INVENTION

However, in the manufacturing methods of the laminated wafer illustrated in the aforementioned conventional Patent Documents 1 and 2, the electric resistance of the two substrates prior to the lamination is relatively large, so that static electricity is generated in the substrate that can not be removed by the ionizer by contacting a portion of the substrate with a conductive member, which may cause the particles or the like to be adsorbed to the lamination surface of the substrate. For this reason, there is a problem that the aforementioned particles or the like cause generation of the lamination defect, such as the void or the blister.

An objective of the present invention is to provide the manufacturing method of the laminated substrate, which can reduce generation of the void or the blister after the bonding heat treatment in lamination and improve the yield of the laminated substrate, and the laminated substrate manufactured by the method.

The present inventors have found that, through fabrication of a laminated substrate utilizing a hydrogen ion implantation separation method (smart-cut method), one of lamination methods, and investigation in detail with regard to a cause of generation of a defect, i.e., a void, at the lamination surface of the laminated substrate, the yield of the laminated substrate and resistivity of the substrate are correlated under a certain fixed environment. In other words, the inventors have found that generation frequency of the void is reduced as the resistivity of the substrate is decreased, and the present invention has been reached.

The invention according to claim 1 is, as illustrated in FIG. 1, improvement of a manufacturing method of the laminated substrate, wherein a first semiconductor substrate 11, that is to be an active layer 16, is superimposed on a second semiconductor substrate 12, that is to be a supporting substrate, via an oxide film 11a to form a laminate 13.

The characteristic configuration thereof is that electric resistivity of either or both of the first and second semiconductor substrates 11 and 12 prior to the superimposition is 0.005-0.2 Ωcm.

In the manufacturing method of the laminated substrate described in claim 1, by reducing the electric resistivity of either or both of the first and second semiconductor substrates 11 and 12, static electricity can be discharged, if generated in the substrates 11 and 12, by contacting the substrates 11 and 12 with a member having conductivity, and adsorption of particles due to the static electricity can be constrained, so that generation of a void and a blister resulting from the particles can be reduced. Additionally, since a dopant in the first semiconductor substrate 11 or the second semiconductor substrate 12, that reduces the electric resistance, constrains dislocation movement in the substrates 11 and 12, strength of a laminated substrate 10 can be improved while a slip of the laminated substrate 10 is not generated even if a heat treatment, such as a bonding heat treatment, is carried out.

The invention according to claim 2 is the invention according to claim 1, wherein, as illustrated in FIG. 1, the laminated substrate 10 is maintained in a reduction atmosphere containing a hydrogen gas at 1000-1350° C. for 1-10 hours after lamination of the laminate 13.

In the manufacturing method of the laminated substrate described in claim 2, by maintaining the laminated substrate 10 in the reduction atmosphere containing the hydrogen gas at a temperature range of 1000-1350° C. for 1-10 hours, the dopant which reduces the electric resistance can be removed from an active layer 16, and the electric resistivity of the active layer 16 serves as general 1-10 Ωcm in which a device can be mounted.

The invention according to claim 3 is the invention according to claim 1, wherein, as illustrated in FIG. 1, by superimposing the first semiconductor substrate 11 on the second semiconductor substrate 12 to form the laminate 13 after ion implantation to the first semiconductor substrate 11 in which the oxide film 11a is formed to form an ion implantation region 11b in the first semiconductor substrate 11, and further separating the laminate 13 at the ion implantation region 11b, the active layer 16 is formed on the second semiconductor substrate 12 via the oxide film 11a.

Conventionally, since the laminate is separated at the ion implantation region and the active layer thinner than the second semiconductor substrate is formed on the oxide film, the particles present on the superimposition surface of the substrate tend to expand when the second semiconductor substrate where the active layer is laminated via the oxide film is subjected to the bonding heat treatment at a high temperature. For this reason, the oxide film and the active layer, which are thinner than the second semiconductor substrate and have low mechanical strength, are deformed by the aforementioned expansion force, generating a separating portion at the superimposition surface of the aforementioned substrate and thus a lamination defect is generated.

However, in the manufacturing method of the laminated substrate described in above-described claim 3, the dopant which reduces the electric resistance is present in the oxide film 11a or the active layer 16, so that the dislocation movement in the oxide film 11a or the active layer 16 is constrained, improving the mechanical strength of the oxide film 11a or the active layer 16, which are thinner than the second semiconductor substrate 12. For this reason, since the second semiconductor substrate 12 which is relatively thick and has the high mechanical strength, as well as the oxide film 11a or the active layer 16 with the improved mechanical strength, suppress the aforementioned expansion force if the particles present on the superimposition surface of the substrate tend to expand in the bonding heat treatment at the high temperature, the active layer 16 can be fully laminated substantially to the second semiconductor substrate 12 via the oxide film 11a without generating a separating portion on the aforementioned superimposition surface.

The invention according to claim 4 is the invention according to claim 1, wherein, as illustrated in FIG. 2, the first semiconductor substrate 11 of the laminated laminate 13 is polished to a predetermined thickness to form the active layer 16 after heat treatment for lamination of the laminate 13.

Since the dopant for reducing the electric resistance is added to the first semiconductor substrate 11 or the second semiconductor substrate 12 and the substrates 11 and 12 are subjected to the bonding heat treatment at the high temperature while the substrates 11 and 12 are superimposed to obtain a thickness thicker than the active layer 16, the first and second semiconductor substrates 11 and 12 with the high mechanical strength suppress the aforementioned expansion force even if the particles present on the superimposition surface of the substrate tend to expand in the aforementioned bonding heat treatment, so that the both substrates 11 and 12 can be fully laminated substantially via the oxide film 11a without simply generating a separating portion on the aforementioned superimposition surface.

The invention according to claim 5 is, as illustrated in FIG. 1, the laminated substrate manufactured by the method according to any of the aforementioned claims 1 through 4.

The laminated substrate described in claim 5 is that with the constrained adhesion of the particles to the lamination surface due to the static electricity and the reduced generation of the void or the blister at the lamination surface.

As described above, according to the present invention, the electric resistivity of either or both of the first and second semiconductor substrates before the superimposition for forming the laminate is set to as low as 0.005-0.2 Ωcm, allowing the adhesion of the particles to the substrate to be constrained due to the static electricity. As a result, even if the both substrates superimposed are subjected to the bonding heat treatment at the high temperature, it can reduce the generation of the void at the lamination surface. Additionally, since the dopant in the first or second semiconductor substrates that reduces the electric resistance constrains the dislocation movement in the substrates, the strength of the laminated substrate can be improved while the slip of the laminated substrate is not generated even if such as the bonding heat treatment is carried out for the laminated substrate.

Moreover, by maintaining the laminated substrate after lamination of the laminate in the reduction atmosphere containing the hydrogen gas at 1000-1350° C. for 1-10 hours, the electric resistivity of the first and second semiconductor substrates with the reduced electric resistivity serves as general 1-10 Ωcm, allowing the device to be mounted on the laminated substrate. As a result, the laminated substrate of the present invention can be used as the semiconductor substrate dedicated to the general device.

Furthermore, where the laminated substrate is the semiconductor substrate separated at the aforementioned ion implantation region after the ion implantation region is formed in the first semiconductor substrate in which the oxide film is formed and the first semiconductor substrate is superimposed on the second semiconductor substrate, and where the dopant that reduces the electric resistance is present in the oxide film or the active layer thinner than the second semiconductor substrate, the dislocation movement in the oxide film or the active layer is constrained, resulting in the mechanical strength being improved. As a result, since the aforementioned oxide film or the like as well as the second semiconductor substrate which is thicker than the oxide film or the like suppress the aforementioned expansion force if the particles present on the superimposition surface of the substrate tend to expand in the bonding heat treatment at the high temperature, the laminated substrate can be obtained in which the separation is not generated on the aforementioned superimposition surface.

Furthermore, where the laminated substrate is the semiconductor substrate which forms the active layer by polishing the first semiconductor substrate after the heat treatment for lamination of the laminate, the bonding heat treatment at the high temperature is carried out before the first semiconductor substrate is thinned by polishing, so that the dopant, which is present in the first or second semiconductor substrates thicker than the active layer and which reduces the electric resistance, constrains the dislocation movement in the substrate. As a result, since the mechanical strength of the thick first semiconductor substrate before polishing is higher than the aforementioned thin active layer, the both substrates suppress the expansion force effectively if the particles present on the superimposition surface of the substrate tend to expand in the bonding heat treatment at the high temperature, so that the laminated substrate can be obtained in which the separation is not simply generated on the superimposition surface.

Moreover, the laminated substrate manufactured by the above-described method is that with the reduced generation of the void or the blister at the lamination surface. As a result, in the aforementioned laminated substrate, the separation is not generated at the lamination surface.

DETAILED DESCRIPTION OF THE PREFERRED EMBODIMENTS

Hereinafter, the best modes for carrying out the present invention will be described by reference to the drawings.

First Embodiment of the Present Invention

Figure 1:
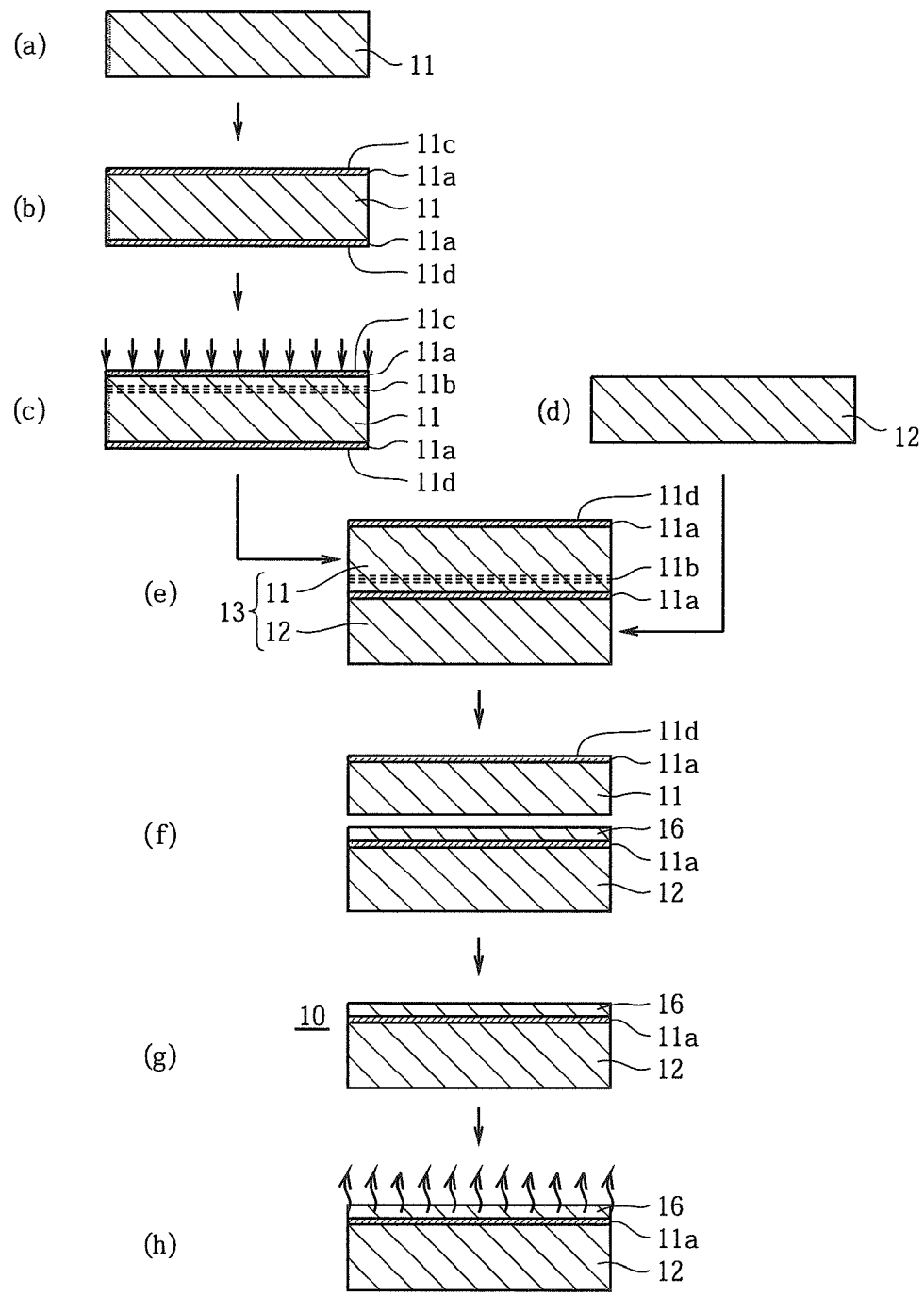
FIG. 1 is a diagram illustrating a manufacturing method in the order of steps of a silicon substrate according to a first embodiment of the present invention.

As illustrated in FIG. 1, a manufacturing method of an SOI substrate 10 according to the present invention includes: an oxide film formation step of forming an oxide film 11a in a first silicon substrate 11 used as an SOI layer 16 (FIG. 1(b)); an ion implantation step of implanting ions into the first silicon substrate 11 to form an ion implantation region 11b in the first silicon substrate 11 (FIG. 1(c)); a laminate formation step of forming a laminate 13 by superimposing the first silicon substrate 11 on a second silicon substrate 12 (FIG. 1(e)); an SOI layer formation step of separating the first silicon substrate 11 at the ion implantation region 11b and forming the SOI layer 16 configured by a single crystal of a thin film on the second silicon substrate 12 via the oxide film 11a (FIGS. 1(f) and (g)); and a hydrogen annealing step of maintaining the SOI substrate 10 in a reduction atmosphere containing a hydrogen gas at a predetermined temperature for a predetermined period of time (FIG. 1(h)).

(A) Oxide Film Formation Step

As illustrated in FIG. 1(a), the first silicon substrate 11 and the second silicon substrate 12 are prepared. The first silicon substrate 11 and the second silicon substrate 12 have the same surface area. The first silicon substrate 11 and the second silicon substrate 12 are manufactured by the Czochralski method, and boron, if the silicon substrate is P type, or phosphorus, if it is N type, is generally added as a dopant by high concentration in a silicon melt. Additionally, the silicon substrate has low electric resistivity of 0.005-0.2 Ωcm, preferably 0.005-0.05 Ωcm. It should be noted that the electric resistivity is limited here within a range of 0.005-0.2 Ωcm because, where it is less than 0.005 Ωcm, it would be difficult to outdiffuse the dopant such as boron sufficiently in the subsequent hydrogen annealing step and it would be difficult to pull up a single crystal which does not generate disposition when pulling up the single crystal in the Czochralski method due to the increase in dopant amount, and because lamination yield would hardly increase where it exceeds 0.2 Ωcm.

Next, as illustrated in FIG. 1(b), the oxide film 11a ($SiO_2$ film) which is an insulator layer is formed in the entire surface including a first principal surface 11c and a second principal surface 11d of the substrate 11 by thermally oxidizing the above first silicon substrate 11 at the temperature of 900° C. or higher. The above oxide film 11a is formed in the thickness of 50-300 nm, preferably 100-200 nm. It should be noted that the thickness of the oxide film 11a is limited here within a range of 50-300 nm because, the defect would be generated easily at a lamination interface resulting in the decrease in lamination yield where it is less than 50 nm, and because, where it exceeds 300 nm, the required film thickness (20-100 nm) of the SOI layer 11c would not be obtained due to the insufficient depth of ion implantation via the oxide film 11a with an accelerating voltage of a general ion implantation apparatus. While the oxide film is formed only in the first silicon substrate in the embodiment, the oxide film may be formed only in the second silicon substrate or in both of the first and second silicon substrates.

(B) Ion Implantation Step

From the first principal surface 11c side of the above first silicon substrate 11 in which the oxide film 11a is formed, a hydrogen molecule ion ($H_2^+$) with the dose of $2.5 \times 10^{16}/cm^2$ or more, or a hydrogen ion ($H^+$) which is a hydrogen gas ion with the dose of $5.0 \times 10^{16}/cm^2$ or more is implanted (FIG. 1(c)). The ion implantation region 11b is formed in the interior of the first silicon substrate 11 in parallel with the oxide film 11a by implanting the hydrogen molecule ion or hydrogen gas ion. At this time, since the generation of a charged hole or kink site (site where the bond is disconnected) is promoted in the first silicon substrate 11 containing a large amount of the dopant, a crystal defect generated by implantation of the hydrogen ion can be promptly recovered and recrystallized. As a result, damage to the crystal by implantation of the hydrogen ion can be constrained, allowing the quality SOI layer 16 to be obtained. In the case of the hydrogen gas ion ($H^+$), twice the implantation amount of the hydrogen molecule ion ($H_2^+$) is required. Additionally, the thickness of the above ion implantation region 11b is set to 200-1200 nm, preferably 500-700 nm. The thickness of the ion implantation region 11b is limited here within a range of 200-1200 nm because the defect would be easily generated after the separation heat treatment where it is less than 200 nm and the implantation of such a depth or more by the general ion implantation apparatus would be impossible where it exceeds 1200 nm.

(C) Laminate Formation Step

After washing the above first and second silicon substrates 11 and 12 by the RCA method, the laminate 13 is formed by superimposing the first silicon substrate 11 on the second silicon substrate 12 via the oxide film 11a at room temperature (FIG. 1(e)). They are superimposed so that the oxide film 11a on the first principal surface 11c side of the first silicon substrate 11 contacts the second silicon substrate 12. Since the electric resistance of the first and second silicon substrates 11 and 12 is low, the static electricity in the both substrates 11 and 12 can be discharged from a wafer chuck by forming the wafer chuck for conveying these substrates 11 and 12 with a conductive material, such as a stainless steel or conductive ceramics, and contacting the grounded wafer chuck with the substrates 11 and 12. As a result, adhesion of the particle to the surfaces of the both substrates 11 and 12 due to the static electricity can be constrained. Particularly, adsorption of a polymer organic substance among the particles with many carbon atoms which is easy to polarize to the surfaces of the substrates 11 and 12 can be constrained. It should be noted that, where the washing by the RCA method is carried out after removing the oxide film on the second principal surface of the first silicon substrate by such as etching and then the first silicon substrate is superimposed via the oxide film on its first principal surface side on the second silicon substrate, and where the wafer chuck for conveying the laminate is formed by the conductive material such as the stainless steel or the conductive ceramics while being grounded, the electric resistance of the second principal surface of the first silicon substrate contacting with the wafer chuck is extremely reduced, allowing the static electricity in the laminate to be discharged further effectively from the wafer chuck.

(D) SOI Layer Formation Step

The above laminate 13 is placed in a furnace and is heat-treated. Heat treatment temperature is 450° C. or higher, preferably 500-700° C., and heat treating time is 1-60 minutes, preferably 10-30 minutes. The heat treatment temperature is limited here to 450° C. or higher because the separation would not be achieved at the ion implantation region 11b where it is below 450° C. Additionally, the heat treating time is limited within a range of 1-60 minutes because it would cause the failure that the separation is achieved completely at the ion implantation region 11b where it is below 1 minute and it would cause the failure that a throughput becomes long and productivity gets worse where it exceeds 60 minutes. The atmosphere in the furnace during the above heat treatment is an inert gas atmosphere such as nitrogen gas, argon gas, or the like. By carrying out the above heat treatment, the separation is achieved at the ion implantation region 11b in the first silicon substrate 11, so that the SOI substrate 10 can be obtained that is configured by the second silicon substrate 12 in which the SOI layer 16 is laminated via the oxide film 11a.

The bonding heat treatment is performed for the SOI substrate 10. Specifically, the SOI substrate is maintained in the inert gas atmosphere at 1000-1300° C., preferably 1100-1200° C. for 1-3 hours, preferably 1-2 hours. The temperature of the bonding heat treatment is limited here within a range of 1000-1300° C. because the bonding of the lamination surface would be insufficient where it is below 1000° C. and it would cause the failure that a slip transition is generated where it exceeds 1300° C. Since the bonding heat treatment is carried out at the high temperature, the particles tend to expand if the particles are present on the lamination surface. However, since the dopant which reduces the electric resistance is present in the oxide film 11a or the SOI layer 16, the dislocation movement in the oxide film 11a or the SOI layer 16 is constrained, resulting in the improvement in mechanical strength of the oxide film 11a or the SOI layer 16, which is thinner than the second silicon substrate 12. For this reason, since the second semiconductor substrate 12 which is relatively thick and has the high mechanical strength, as well as the oxide film 11a or the SOI layer 16 with the improved mechanical strength, suppress the above expansion force if the particles present on the superimposition surface of the substrate tend to expand in the bonding heat treatment at the high temperature, the SOI layer 16 can be fully laminated substantially to the second semiconductor substrate 12 via the oxide film 11a without generating a separating portion on the above superimposition surface. As a result, the particles, if present on the lamination surface, hardly turn into the lamination defect such as a void or a blister.

(E) Hydrogen Annealing Step

The above SOI substrate 10 is placed in another furnace and is heat-treated again. The atmosphere in the furnace during the heat treatment is the reduction atmosphere containing hydrogen, the heat treatment temperature is set to 1000-1350° C., preferably 1150-1200° C., and the heat treating time is set to 1-10 hours, preferably 1-3 hours. The heat treatment temperature is limited here within a range of 1000-1350° C. because boron distributed in the SOI layer 16 and the oxide film 11a would not be outdiffused where it is below 1000° C. and, where it exceeds 1350° C., it would be difficult to constrain such as the slip if a plane supporting boat such as a susceptor is used. Additionally, the heat treating time is limited here within a range of 1-10 hours because boron distributed in the SOI layer 16 and the oxide film 11a would not be outdiffused where it is below 1 hour and the slip would be easily generated and the productivity would get worse where it exceeds 10 hours. By the heat treatment, boron distributed in the SOI layer 16 and the oxide film 11a outdiffuses and much boron in the SOI layer 16 and the oxide film 11a escapes from the SOI layer 16 and the oxide film 11a, resulting in the electric resistivity of the SOI substrate 10 being set to the general electric resistivity value of 1-10 Ωcm. The heat treatment at the high temperature in the reduction atmosphere containing hydrogen promotes the bonding at the lamination interface of the SOI layer 16 and the second silicon substrate 12 via the oxide film 11a, and has the effect in which flatness of the SOI layer surface is further enhanced. Moreover, since the second silicon substrate 12 is thicker than the SOI layer 16, the much dopant such as boron, still remains in the second silicon substrate 12 by the hydrogen annealing treatment. As a result, since the dopant in the second silicon substrate 12 constrains the dislocation movement in the substrate 12, the strength of the SOI substrate 10 can be improved.

Second Embodiment of the Present Invention

Figure 2:
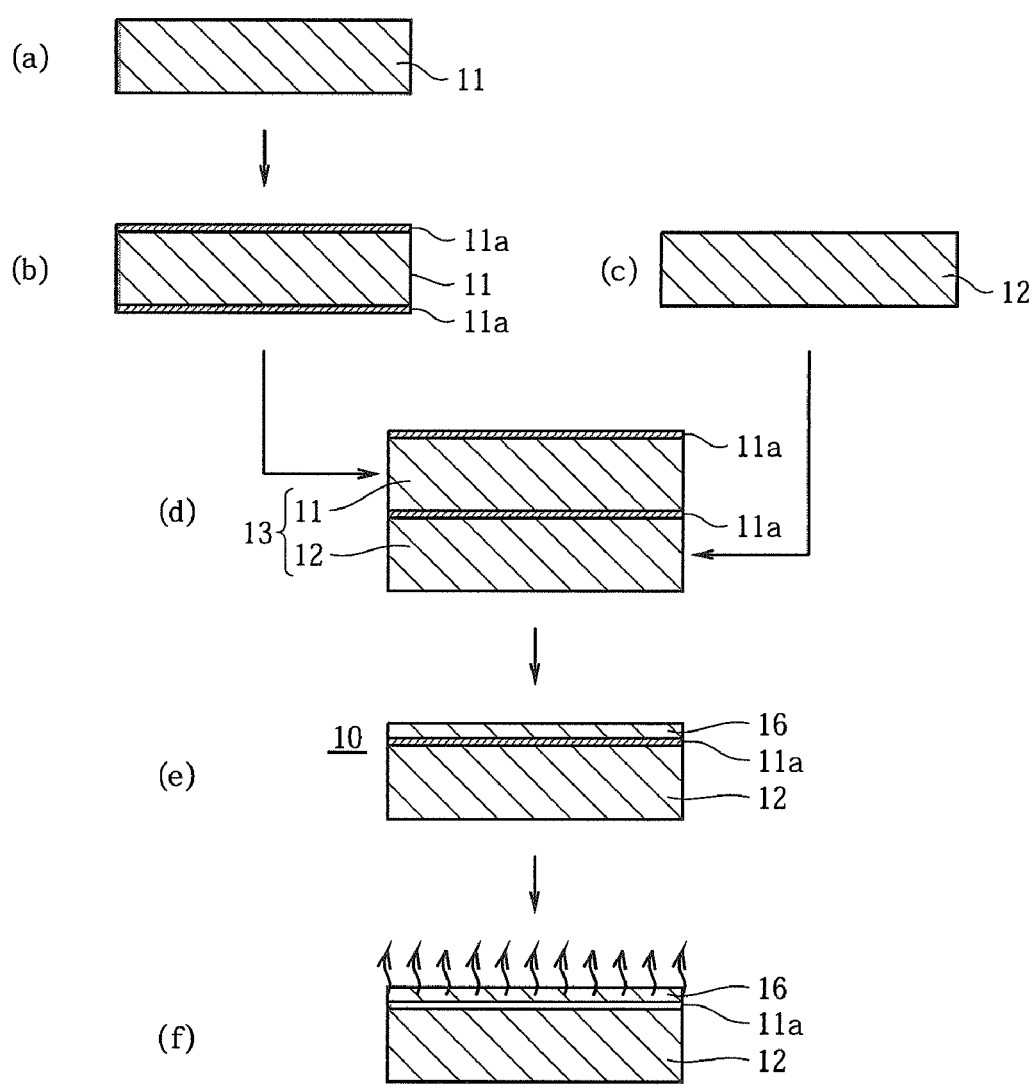
FIG. 2 is a diagram illustrating the manufacturing method in the order of steps of the silicon substrate according to a second embodiment of the present invention.

FIG. 2 illustrates a second embodiment of the present invention. In FIG. 2, the same numerals as FIG. 1 illustrate the same parts.

The embodiment is a method of forming the thin film SOI substrate in which the first and second silicon substrates 11 and 12 are laminated via the oxide film 11a without forming the ion implantation region in the first silicon substrate 11, and the first silicon substrate 11 is polished after carrying out the bonding heat treatment for the laminate 13. Specifically, the first silicon substrate 11 is superimposed on the second silicon substrate 12 via the oxide film 11a at room temperature to form the laminate 13 in the laminate formation step (FIG. 2(d)), the laminate 13 is placed in the furnace and laminated while maintained in the nitrogen ($N_2$) atmosphere or the oxygen ($O_2$) atmosphere at 1000-1300° C., preferably 1100-1200° C., for 1-3 hours, preferably 1-2 hours in the bonding heat treatment step, and the SOI substrate 10 having the thin film SOI layer 16 is obtained by polishing the first silicon substrate 11 in the SOI layer formation step (FIG. 2(e)). It is constituted identically to the first embodiment except the above.

Although the particles present on the superimposition surface of the substrate tend to expand when the bonding heat treatment is carried out for the above laminate 13, the first and second silicon substrates 11 and 12 having the high mechanical strength suppress the above expansion force, so that the both substrates 11 and 12 can be fully laminated substantially via the oxide film 11a without simply generating a separating portion on the above superimposition surface.

While silicon is mentioned as the semiconductor in the above first and second embodiments, they may be applied to the semiconductor such as SiGe, SiC, Ge, or the like.

EXAMPLES

Hereinafter, examples of the present invention will be described in detail with comparative examples.

Example 1

As illustrated in FIG. 1, the first and second silicon substrates 11 and 12 are prepared firstly, which are respectively made of the P type silicon wafers having the electric resistivity of 0.005 Ωcm and oxygen concentration of $10\text{-}13\times10^{17}$ atoms/cm$^3$ (the former ASTM (American Society for Testing Materials)). Boron is used as the dopant. Subsequently, the first silicon substrate 11 is heat-treated in the dry oxygen atmosphere held at 1050° C. for 4 hours to form the oxide film 11a of 0.15-0.2 μm (1500-2000 Å) over the entire surface of the first silicon substrate 11. Then, the ion implantation is carried out to the first principal surface 11c of the first silicon substrate 11 with the pouring energy of 50 keV and the dose of $6\times10^{16}$/cm$^2$ of hydrogen molecule ion ($H_2^+$) to form the ion implantation region 11b in the first silicon substrate 11. Next, after washing the first and second silicon substrates 11 and 12, the laminate 13 is formed by superimposing the first silicon substrate 11 on the second silicon substrate 12 so that the oxide film 11a on the first principal surface 11c side of the first silicon substrate 11 contacts the second silicon substrate 12.

The laminate 13 is placed in the heat treat furnace and the nitrogen ($N_2$) gas atmosphere in the furnace is heated to 500° C., which is maintained for 30 minutes, so that the laminate 13 is separated at the ion implantation region 11b. Thereby, the SOI substrate 10 is obtained which is configured by the second silicon substrate 12 in which the SOI layer 16 is laminated via the oxide film 11a. Subsequently, after carrying out the bonding heat treatment by maintaining the SOI substrate 10 in the argon gas atmosphere at 1100° C. for 2 hours, the SOI substrate 10 is maintained in the reduction atmosphere containing the hydrogen gas at 1200° C. for 1 hour to carry out a de-doping treatment. The SOI substrate 10 here is regarded as Example 1.

Example 2

The SOI substrate is obtained by the same process as Example 1 excluding that the electric resistivity of the first and second silicon substrates is altered to 0.01 Ωcm. The SOI substrate here is regarded as Example 2.

Example 3

The SOI substrate is obtained by the same process as Example 1 excluding that the electric resistivity of the first and second silicon substrates is altered to 0.05 Ωcm. The SOI substrate here is regarded as Example 3.

Example 4

The SOI substrate is obtained by the same process as Example 1 excluding that the electric resistivity of the first and second silicon substrates is altered to 0.2 Ωcm. The SOI substrate here is regarded as Example 4.

Example 5

The SOI substrate is obtained by the same process as Example 1 excluding that the electric resistivity of the first silicon substrate is set to 0.005 Ωcm and the electric resistivity of the second silicon substrate is altered to 1 Ωcm. The SOI substrate here is regarded as Example 5.

Example 6

The SOI substrate is obtained by the same process as Example 1 excluding that the electric resistivity of the first silicon substrate is altered to 0.01 Ωcm and the electric resistivity of the second silicon substrate is altered to 1 Ωcm. The SOI substrate here is regarded as Example 6.

Example 7

The SOI substrate is obtained by the same process as Example 1 excluding that the electric resistivity of the first silicon substrate is altered to 0.05 Ωcm and the electric resistivity of the second silicon substrate is altered to 1 Ωcm. The SOI substrate here is regarded as Example 7.

Example 8

The SOI substrate is obtained by the same process as Example 1 excluding that the electric resistivity of the first silicon substrate is altered to 0.2 Ωcm and the electric resistivity of the second silicon substrate is altered to 1 Ωcm. The SOI substrate here is regarded as Example 8.

Example 9

The SOI substrate is obtained by the same process as Example 1 excluding that the electric resistivity of the first silicon substrate is altered to 1 Ωcm and the electric resistivity of the second silicon substrate is altered to 0.005 Ωcm. The SOI substrate here is regarded as Example 9.

Example 10

The SOI substrate is obtained by the same process as Example 1 excluding that the electric resistivity of the first silicon substrate is altered to 1 Ωcm and the electric resistivity of the second silicon substrate is altered to 0.01 Ωcm. The SOI substrate here is regarded as Example 10.

Example 11

The SOI substrate is obtained by the same process as Example 1 excluding that the electric resistivity of the first silicon substrate is altered to 1 Ωcm and the electric resistivity of the second silicon substrate is altered to 0.05 Ωcm. The SOI substrate here is regarded as Example 11.

Example 12

The SOI substrate is obtained by the same process as Example 1 excluding that the electric resistivity of the first silicon substrate is altered to 1 Ωcm and the electric resistivity of the second silicon substrate is altered to 0.2 Ωcm. The SOI substrate here is regarded as Example 12.

Comparative Examples 1, 3, and 5

The SOI substrate is obtained by the same process as Example 1 excluding that the electric resistivity of the first and second silicon substrate is altered to 1 Ωcm, respectively. The SOI substrate here is regarded as Comparative Examples 1, 3, and 5.

Comparative Example 2

The SOI substrate is obtained by the same process as Example 1 excluding that the electric resistivity of the first and second silicon substrate is altered to 10 Ωcm. The SOI substrate here is regarded as Comparative Example 2.

Comparative Example 4

The SOI substrate is obtained by the same process as Example 1 excluding that the electric resistivity of the first silicon substrate is altered to 10 Ωcm and the electric resistivity of the second silicon substrate is altered to 1 Ωcm. The SOI substrate here is regarded as Comparative Example 4.

Comparative Example 6

The SOI substrate is obtained by the same process as Example 1 excluding that the electric resistivity of the first silicon substrate is altered to 1 Ωcm and the electric resistivity of the second silicon substrate is altered to 10 Ωcm. The SOI substrate here is regarded as Comparative Example 6.

(Evaluation)

The void is identified by visually observing appearances on the surfaces of the SOI substrates of Examples 1-12 and Comparative Examples 1-6. This results from that the void can be observed with the naked eye without utilizing a special apparatus because a portion where the void presents is seen bulged if the SOI layer is formed as the thin film. The result is illustrated in Table 1 and FIG. 3. In Table 1 and FIG. 3, the "lamination yield" is a generation yield of the void when using the first and second silicon substrates having the electric resistivity of 10 Ωcm, respectively, which value is set to 1, so as to define change rates of the generation yield of the void when the each electric resistivity of the first and second silicon substrates is altered. In Table 1, the electric resistivities of the first and second silicon substrates are also illustrated.

TABLE 1

|  | Electric resistivity of first silicon substrate (Ωcm) | Electric resistivity of second silicon substrate (Ωcm) | Lamination yield |
|---|---|---|---|
| Example 1 | 0.005 | 0.005 | 1.23 |
| Example 2 | 0.01 | 0.01 | 1.21 |
| Example 3 | 0.05 | 0.05 | 1.20 |
| Example 4 | 0.2 | 0.2 | 1.18 |
| Example 5 | 0.005 | 1 | 1.18 |
| Example 6 | 0.01 | 1 | 1.17 |
| Example 7 | 0.05 | 1 | 1.15 |
| Example 8 | 0.2 | 1 | 1.12 |
| Example 9 | 1 | 0.005 | 1.16 |
| Example 10 | 1 | 0.01 | 1.15 |
| Example 11 | 1 | 0.05 | 1.14 |
| Example 12 | 1 | 0.2 | 1.10 |
| Comparative example 1 | 1 | 1 | 1.02 |
| Comparative example 2 | 10 | 10 | 1 |
| Comparative example 3 | 1 | 1 | 1.02 |
| Comparative example 4 | 10 | 1 | 1 |
| Comparative example 5 | 1 | 1 | 0.95 |
| Comparative example 6 | 1 | 10 | 1 |

Figure 3:
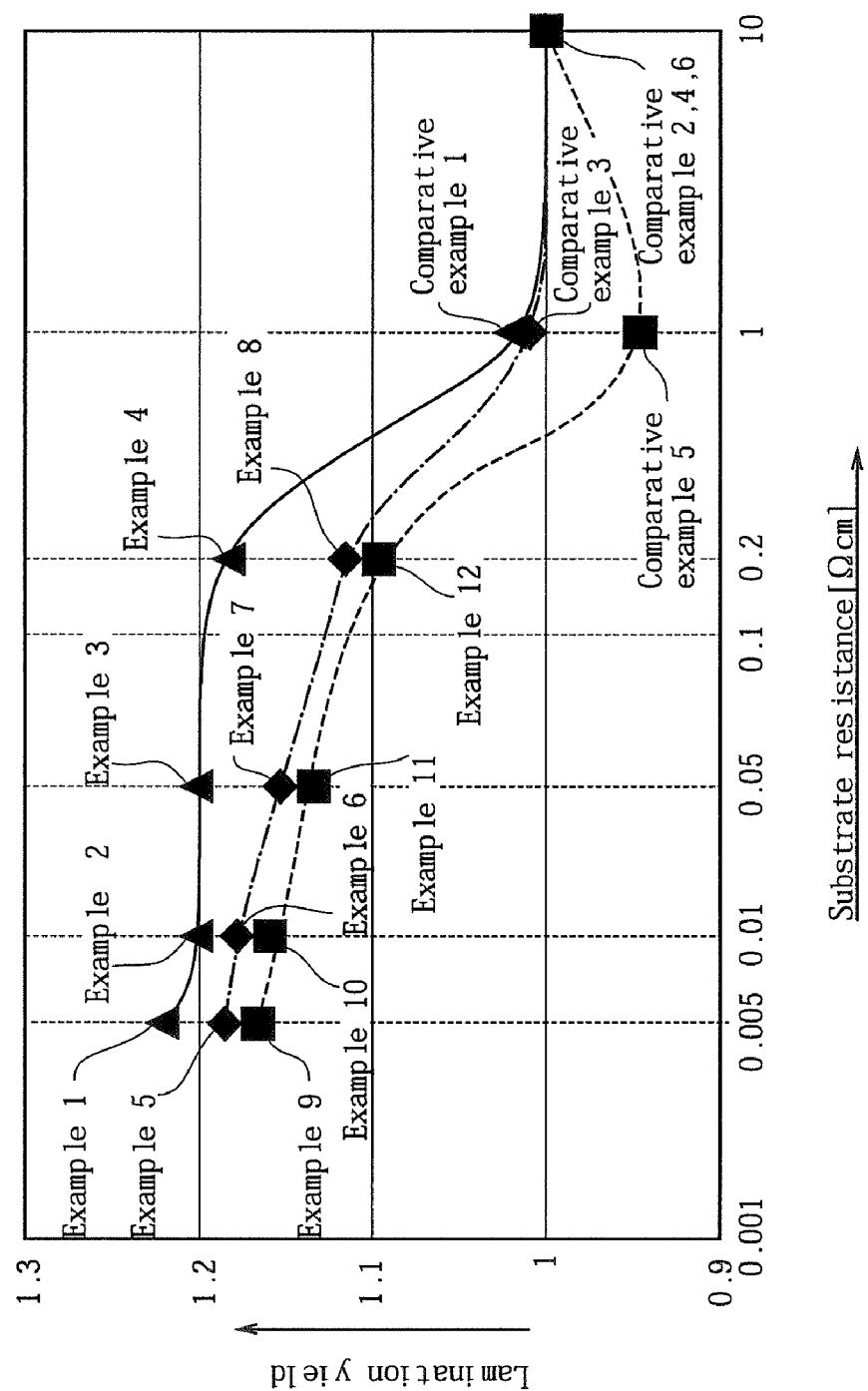
FIG. 3 is a diagram illustrating change in lamination yield to change in substrate resistance of examples 1-12 and comparative examples 1-6.
Figure 4:
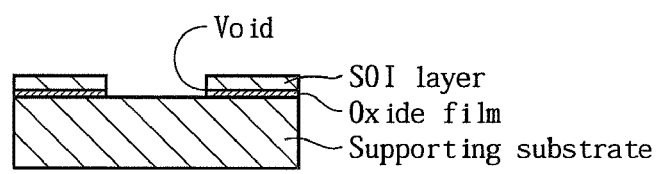
FIG. 4 is a cross sectional view of a void as a lamination defect corresponding to FIG. 1.
Figure 5:
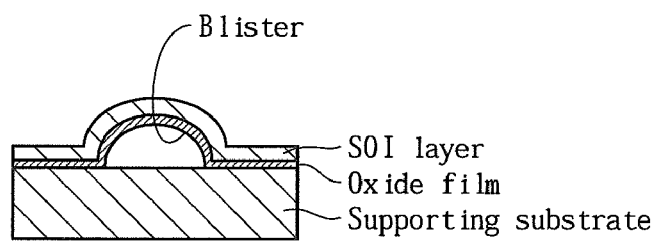
FIG. 5 is a cross sectional view of a blister as the lamination defect corresponding to FIG. 1.

As can be seen in Table 1 and FIG. 3, as compared to that the lamination yields of Comparative Examples 1-6 are 0.95-1.02, the lamination yields of examples 1-12 are increased to 1.10-1.23. In other words, the lamination yield is increased by utilizing the substrate with the low resistivity of 0.2 Ωcm or less. As shown, the lamination yield in Examples is highest in Example 1, and then decreased in Example 2, Example 3, Example 4, Example 5, Example 6, Example 9, Example 7, Example 10, Example 11, Example 8, and Example 12 in that order, which indicates that Example 1 using the first and second silicon substrates with the low electric resistivity of 0.005 Ωcm has achieved the best result. It should be noted that the values of the lamination yield in Comparative Examples 1, 3, and 5 are not consistent while the first and second silicon substrates therein have the identical resistivity of 1 Ωcm, respectively, because the lamination yield of Comparative Examples 2, 4, and 6 where the electric resistivity of either or both of the first and second silicon substrates differs is defined as 1.

What is claimed is:

1. A method for manufacturing a laminated substrate, comprising forming a laminate by superimposing a first silicon substrate, as an active layer, on a second silicon substrate, as a supporting substrate, via an oxide film,
    wherein the electric resistivity of both of said first silicon substrate and said second silicon substrate before superimposition is 0.005-0.2 Ωcm,
    wherein a wafer chuck for conveying both the first and second silicon substrates is formed with a conductive material and is grounded, and
    wherein the static electricity in both substrates is discharged from the grounded wafer chuck when superimposing both substrates.

2. The method according to claim 1, wherein the laminated substrate is maintained in a reduction atmosphere containing hydrogen gas at 1000-1350° C. for 1-10 hours after lamination of said laminate.

3. The method according to claim 1, wherein said laminate is formed by superimposing said first silicon substrate on said second silicon substrate after ion implantation is carried out in said first silicon substrate to form an ion implantation region in said first silicon substrate, and wherein said active layer is then formed on said second silicon substrate via said oxide film by separating said laminate at said ion implantation region.

4. The method according to claim 1, wherein said active layer is formed by polishing said first silicon substrate to a predetermined thickness after heat-treating said laminate for lamination.

* * * * *